(12) United States Patent
Schmid

(10) Patent No.: US 11,462,993 B2
(45) Date of Patent: Oct. 4, 2022

(54) CONTROLLER FOR DETERMINING DEAD TIMES FOR POWER ELECTRONICS HALF-BRIDGES

(71) Applicant: ZF Friedrichshafen AG, Friedrichshafen (DE)

(72) Inventor: Andreas Schmid, Wangen im Allgäu (DE)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 0 days.

(21) Appl. No.: 17/271,547

(22) PCT Filed: Feb. 21, 2020

(86) PCT No.: PCT/EP2020/054575
§ 371 (c)(1),
(2) Date: Feb. 25, 2021

(87) PCT Pub. No.: WO2020/193026
PCT Pub. Date: Oct. 1, 2020

(65) Prior Publication Data
US 2021/0249948 A1    Aug. 12, 2021

(30) Foreign Application Priority Data

Mar. 27, 2019 (DE) .................... 10 2019 204 280.5

(51) Int. Cl.
*H02M 1/38* (2007.01)
*B60L 15/20* (2006.01)
(Continued)

(52) U.S. Cl.
CPC .............. *H02M 1/38* (2013.01); *B60L 15/20* (2013.01); *H03K 17/284* (2013.01); *B60K 6/22* (2013.01);
(Continued)

(58) Field of Classification Search
None
See application file for complete search history.

(56) References Cited

U.S. PATENT DOCUMENTS 7,880,454 B2 *  2/2011  Latham, II .......... H02M 3/1588
                                                         323/284
9,294,001 B2 *  3/2016  Kimura .............. H02M 3/3376
(Continued)

FOREIGN PATENT DOCUMENTS

DE    102015223727 A1    6/2017
DE    102019204280 A1    10/2020
(Continued)

OTHER PUBLICATIONS

Search Report issued in German Patent Application No. DE 10 2019 204 280.5 dated Nov. 29, 2019 (14 pages).
(Continued)

*Primary Examiner* — Daniel C Puentes
*Assistant Examiner* — Khareem E Almo
(74) *Attorney, Agent, or Firm* — Crowell & Moring LLP

(57) ABSTRACT

A controller for controlling a bridge circuit in a vehicle power module, comprising an input interface for receiving an output current from the bridge circuit, an evaluation unit for determining an adaptive dead time based on the output current, wherein the adaptive dead time is coupled to a predetermined commutation time for the bridge circuit and limited by a predetermined minimum value, and a signal unit for generating a control signal for sending the adaptive dead time to the bridge circuit.

14 Claims, 2 Drawing Sheets

(51) Int. Cl.
*H03K 17/284* (2006.01)
*B60K 6/22* (2007.10)

(52) U.S. Cl.
CPC ....... *B60Y 2200/91* (2013.01); *B60Y 2200/92* (2013.01)

(56) References Cited

U.S. PATENT DOCUMENTS

| | | | | |
|---|---|---|---|---|
| 9,577,525 | B2* | 2/2017 | Biondi | H02M 3/158 |
| 10,507,731 | B2* | 12/2019 | Tsukada | B60L 3/0007 |
| 10,525,841 | B2* | 1/2020 | Zhou | H03K 17/168 |
| 10,658,937 | B1* | 5/2020 | Zafarana | H02M 3/33592 |
| 10,951,161 | B2* | 3/2021 | Freeman | H02S 40/32 |
| 2005/0253165 | A1* | 11/2005 | Pace | H02M 7/538 |
| | | | | 257/139 |
| 2011/0012577 | A1* | 1/2011 | Wang | H02M 1/38 |
| | | | | 323/283 |
| 2013/0033248 | A1* | 2/2013 | Granger | H02M 3/1588 |
| | | | | 323/288 |
| 2015/0256074 | A1* | 9/2015 | Biondi | H02M 1/38 |
| | | | | 323/271 |
| 2020/0389163 | A1* | 12/2020 | Apelsmeier | H02M 1/38 |
| 2021/0057984 | A1* | 2/2021 | Geyer | H02M 7/5387 |
| 2021/0249948 | A1* | 8/2021 | Schmid | B60L 15/20 |

FOREIGN PATENT DOCUMENTS

| | | |
|---|---|---|
| EP | 1230734 | 6/2007 |
| WO | WO 01/22585 A1 | 3/2001 |
| WO | WO 2015/079573 A1 | 6/2015 |
| WO | WO 2020/193026 A1 | 10/2020 |

OTHER PUBLICATIONS

International Search Report (with English translation) and Written Opinion issued in PCT/EP2020/054575 dated May 20, 2020 (12 pages).

Gupta Vidisha et al, "Phase-staggered multiple ZVS inverters for grid-connected PV systems", 2013 IEEE Energy Conversion Congress and Exposition, IEEE, (Sep. 15, 2013), doi:10.1109/ECCE.2013.6647303, pp. 4503-4510, XP032516217 [X] 1-7 * Kapitel III, IV, V;; figures 2,3,7,9 * [I] 8-11.

Angel V Peterchev et al, "Digital Multimode Buck Converter Control With Loss-Minimizing Synchronous Rectifier Adaptation", IEEE Transactions on Power Electronics, Institute of Electrical and Electronics Engineers, USA, (Nov. 1, 2006), vol. 20, No. 6, ISSN 0885-8993, pp. 1588-1599, XP011150091 [X] 1-7 * figures 1,2,3,4,6 * * Kapitel III A, IV C * [I] 8-11.

* cited by examiner

CONTROLLER FOR DETERMINING DEAD TIMES FOR POWER ELECTRONICS HALF-BRIDGES

CROSS-REFERENCE TO RELATED APPLICATIONS

This application is a U.S. national stage application under 35 U.S.C. § 371 of PCT Application No. PCT/EP2020/054575, filed on Feb. 21, 2020, and published as WO 2020/193026 A1 on Oct. 1, 2020, which claims priority from German Application No. DE 10 2019 204 280.5, filed on Mar. 27, 2019, the entirety of which are each hereby fully incorporated by reference herein.

TECHNICAL FIELD

The present invention relates to the field of semiconductor-based power modules. In particular, the present invention relates to a controller for determining a dead time for power electronics switches, such as a converter for an electric and/or hybrid vehicle.

TECHNICAL BACKGROUND

Power electronics switches or circuits are currently used in numerous applications. In particular in the progressing field of electromobility, power electronics plays a key role. With an increasing number of functions integrated in vehicles, the number and complexity of the power electronics therein has also increased.

Bridge circuits are used with many power electronics circuits such as power packs and converters, typically comprised of an upper (high side) switch and a lower (low side) switch. The high side switch (HS switch) can comprise a transistor, such as a field-effect transistor (FET), which switches a load to a supply voltage. The low side switch (LS switch) can likewise comprise a transistor, such as a FET, which switches a load to the ground (or earth).

Such a bridge circuit is known, e.g. from EP1230734B1.

The two switches should be inverted in relation to one another when in operation. When switching on and off, there is a delay in both an HS switch as well as an LS switch. This can be attributed to the fact that after applying a gate-source voltage ($V_{GS}$), the reaction of the drain-source voltage ($V_{DS}$) to the latter is delayed. The switches have delays of different lengths, however, due to the different reaction speeds of the drain-source voltage to the gate-source voltage, as well as different rising and lowering times when switching on and off. The rising and lowering times relate to the time it takes for the drain-source voltage to reach an end value. As a result, the two switches are switched on and off at different speeds. Consequently, something is needed to be able to operate the HS and LS switches such that they are inverted in relation to one another. Otherwise, there would be overlapping phases when both switches conduct simultaneously, resulting in a high crosscurrent flowing from one of the two switches to the other switch, forming the equivalent of a short circuit that destroys the entire power switch.

In addition, with modern power switches, which comprise, e.g., a metal-oxide-semiconductor FET (MOSFET) or a gallium nitride (GaN) based high-electron-mobility transistor (GaN-HEMT), the delay when switching off is normally substantially longer than when switching on.

Various solutions have been proposed in the past for resolving the above problem. By way of example, a so-called "dead time" (or locking time) is introduced, which is defined as that time period in which neither the HS switch, nor the LS switch are on. This prevents short circuiting the supply voltage, and thus a crosscurrent.

The power electronics switches known from the prior art nevertheless have high conductance losses. This is because the dead time is not the right length, and in many cases is too long. Power semiconductors that enable reverse conductance have a significantly increased forward voltage when switched off. Consequently, a long dead time results in an increase in conductance losses in the reverse conductance.

The fundamental object of the invention is therefore to optimize the dead time in power electronics switches, such that the conductance losses in the reverse conductance are reduced.

This object is achieved by a controller, a control method, an optimization method, a computer program, a computer-based storage medium, and a data transfer signal according to the independent claims.

The vehicle power module comprises at least one power semiconductor that can be switched to a reverse direction. This can be, e.g., a semiconductor with large bandgaps (wide bandgap semiconductors), such as gallium nitride (GaN), or silicon carbide (SiC). The vehicle power module can comprise one or more metal-oxide semiconductor field-effect transistors (MOSFETs), and one or more high-electron-mobility transistors (HEMTs).

The bridge circuit can be a half-bridge comprising an HS switch and an LS switch. Alternatively, the bridge circuit can be a so-called multi-level half-bridge. The input interface can be, e.g., an analog-digital transformer or an interface for a data line (e.g. a serial peripheral interface, SPI).

The output current can be obtained from a current transformer, ampere meter, or a data line. The evaluation unit comprises, e.g., a microcontroller or a field-programmable gate array (FPGA), or it is part of the microcontroller that reads the output current and determines the adaptive dead time therefrom. This can involve three determination variations: according to a first determination variation, the evaluation unit measures the commutation time and the minimum value for the dead time of the bridge circuit by means of a measurement module integrated in the latter, or connected thereto. The evaluation unit subsequently uses the commutation time and the minimum value to determine the adaptive dead time by combining these two measurement values. In this case, the word "predetermined" in conjunction with the commutation time and minimum value means that these two measurement values have been determined by the evaluation unit prior to combining them.

According to a second determination variation, the evaluation unit uses a commutation time and a minimum value, wherein these two measurement values are obtained by means of characterizing another bridge circuit (e.g. a prototype). The evaluation unit subsequently uses the commutation time and the minimum value to determine the adaptive dead time by combining these two measurement values. In this case, the word "predetermined" in conjunction with the commutation time and the minimum value has the same meaning as in the first determination variation, in that these two measurement values have been determined prior to their combination by means of the characterization (on the prototype).

According to a third determination variation, the evaluation unit uses a commutation time and a minimum value, wherein these two measurement values are obtained by means of characterizing another bridge circuit (e.g. on a prototype), and combined. In this case, the word "predetermined" in conjunction with the commutation time and the minimum value means that these two measurement values are determined and combined prior to the time at which they are provided to the evaluation unit for determining the adaptive dead time. By way of example, the controller can comprise a storage medium for storing the predetermined and combined commutation time and minimum value for the dead time, based on the output current for the characterizing bridge circuit (prototype).

According to a preferred embodiment, the commutation time is defined as a time period, within which a drain-source voltage ($V_{DS}$) for the bridge circuit decreases from a starting value to 30%, 25%, 20%, 15%, 10%, 5%, or 0% thereof.

Based on the adaptive dead time, a control signal is generated by the signal unit, wherein the control signal provides the adaptive dead time to the bridge circuit. The control signal can comprise a first pulse-width modulation signal (PWM signal) for an upper switch (HS switch) in the bridge circuit, and a second pulse-width modulation signal (PWM signal) for a lower switch (LS switch) in the bridge circuit.

The controller and control method according to the invention are advantageous compared to those known from the prior art due to the adaptive dead time. By limiting the adaptive dead time to the predetermined minimum value, the crosscurrent mentioned in the introduction can be prevented or reduced. This prevents a short circuit and a consequential destruction of the power semiconductor due to its overheating. Limiting the dead time to a minimum value is understood to mean that the dead time is greater than or equal to this minimum value.

Furthermore, because the dead time is coupled to the predetermined commutation time, so-called "double switching" is prevented. With power semiconductors, the commutation times increase significantly when the load current decreases, because the switch functioning as a capacitor at the power output is charged comparatively slowly with an output capacitance. If the dead time is shorter than the commutation time, the output capacitor for the respective power switch will not be fully discharged when it is switched on. This results in double switching, or a hard-switching transient, in which the voltage at the switch and the current at the switch are simultaneously not equal to zero. This results in additional losses, which can be prevented when the dead time is greater than or equal to the commutation time. A coupling of the dead time with the commutation time for the bridge circuit is understood to mean that the dead time is the same as the commutation time, or is set in relation to the commutation time via a defined mathematical relationship (e.g. with a constant difference and/or a constant multiplication factor).

Furthermore, an improved control of the bridge circuit with respect to the solutions known from the prior art is obtained, in which the switching behavior of bridge circuit is not necessarily examined when in operation, and must be corrected if a malfunction occurs (e.g. time losses or double switching). In contrast, predetermined commutation times and minimum values for the dead time (e.g. by means of characterizing a prototype) can be used as existing data to determine the dead time that is to be sent to the bridge circuit in the form of a control signal, based on the output current. This enables a simple control of the bridge circuit by means of the optimized adaptive dead time.

Advantageous embodiments and developments are described in the dependent claims.

According to another embodiment, the predetermined minimum value is a function of a switching delay when the bridge circuit is switched on, a switching delay for a gate activation when the bridge circuit is switched on, a switching delay when the bridge circuit is switched off, and/or a switching delay for a gate activation when the bridge circuit is switched off.

By limiting the dead time to this minimum value, crosscurrents can be effectively prevented. In particular, in addition to the delays concerning the reaction of the drain-source voltage to the gate voltage, delays in the gate activation itself can be taken into account when switching on and off. Alternatively or additionally, the minimum value for the dead time determined in this manner can be increased by a buffer value, in order to prevent crosscurrents in practically all operating conditions (e.g. caused by thermal effects, which can have a strong effect on the switching behavior of the power semiconductor).

According to another embodiment, the evaluation unit is configured to set the adaptive dead time to the minimum value for a first portion of the output current above a predefined threshold value and/or to the predetermined commutation time for a second portion of the output current below the threshold value.

The threshold value can be defined on the basis of the predetermined commutation time and/or the predetermined minimum value for the dead time. By way of example, the threshold value is the current value at the intersection between the curve for the commutation time based on the output current (load current) for the characterized bridge circuit (prototype) and the line indicating the constant minimum value for the dead time, plotted on a graph in which the load current is a function of time (commutation time or dead time). This is particularly advantageous with power semiconductors, in which the commutation time decreases as the load current increases.

According to another embodiment, the evaluation unit is configured to select the predetermined commutation time and/or the predetermined minimum value from a table or a variable field, based on the output current.

The table (a reference table), or variable field (an array) are preferably obtained through characterizing the bridge circuit or prototype described above. A first column in the table or variable field contains numerous values for the output current of the bridge circuit. The values for the dead time are listed in the second column of the table or variable field, which have been determined for numerous values of the output current, and are also coupled to the commutation time, and limited to the predetermined minimum value. The evaluation unit can therefore easily access data for the optimized, adaptive dead time that have been obtained by means of a previous prototype characterization, in order to control the bridge circuit on the basis thereof.

Instead of the table or variable field, the evaluation unit can use an approximation formula, obtained, for example, on the basis of the data for the optimized, adaptive dead time obtained previously by means of the aforementioned prototype characterization. The approximation formula thus describes the mathematical relationship of the adaptive dead time obtained by combining the predetermined commutation time with the predetermined minimum value to the load or output current of the characterized bridge circuit (prototype). This enables improved control, because the adaptive dead time can be defined over a comparatively expanded and continuous range instead of just at discrete values for the load current of the bridge circuit.

The computer program according to the invention is configured to be loaded into a memory in a computer and comprises software code segments with which the steps of the method according to the invention are carried out when the computer program is run on the computer.

A program belongs to the software in a data processing system, e.g. an evaluation device or a computer. Software is a general term for programs and associated data. The complement to software is hardware. Hardware refers to the mechanical and electronic components of a data processing system. A computer is an evaluation device.

Computer programs normally comprise a series of commands, by means of which the hardware executes a specific process when the program has been uploaded, to obtain a specific result. When the program in question is used on a computer, the computer program obtains the technical effect according to the invention described above.

The computer program according to the invention is independent of the platform on which it is run. This means that it can be executed on any computer platform. The computer program is preferably executed on an evaluation device according to the invention to detect the environment of the vehicle.

The software code segments are written in an arbitrary programing language, e.g. Python, Java, JavaScript, C, C++, C #, Matlab, LabView, Objective C. Alternatively or additionally, a hardware description language (e.g. VHDL) can be used.

The computer-readable storage medium is an electronic, magnetic, optical, or magneto-optical storage medium, by way of example.

The data transfer signal is a signal that transmits the computer program from a storage medium on which the computer program is stored, to another entity, e.g. another storage medium, server, cloud system, 4G/5G wireless communication system, or a data processing device.

Embodiments shall be described below by way of example, in reference to the attached drawings. Therein:

The same reference symbols are used for the same or functionally similar parts in the figures.

Figure 1:
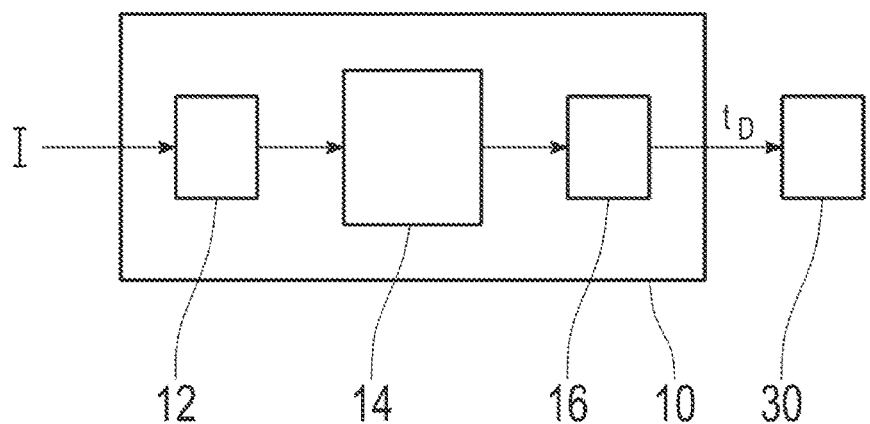
FIG. 1 shows a schematic illustration of a controller according to one embodiment.
Figure 2:
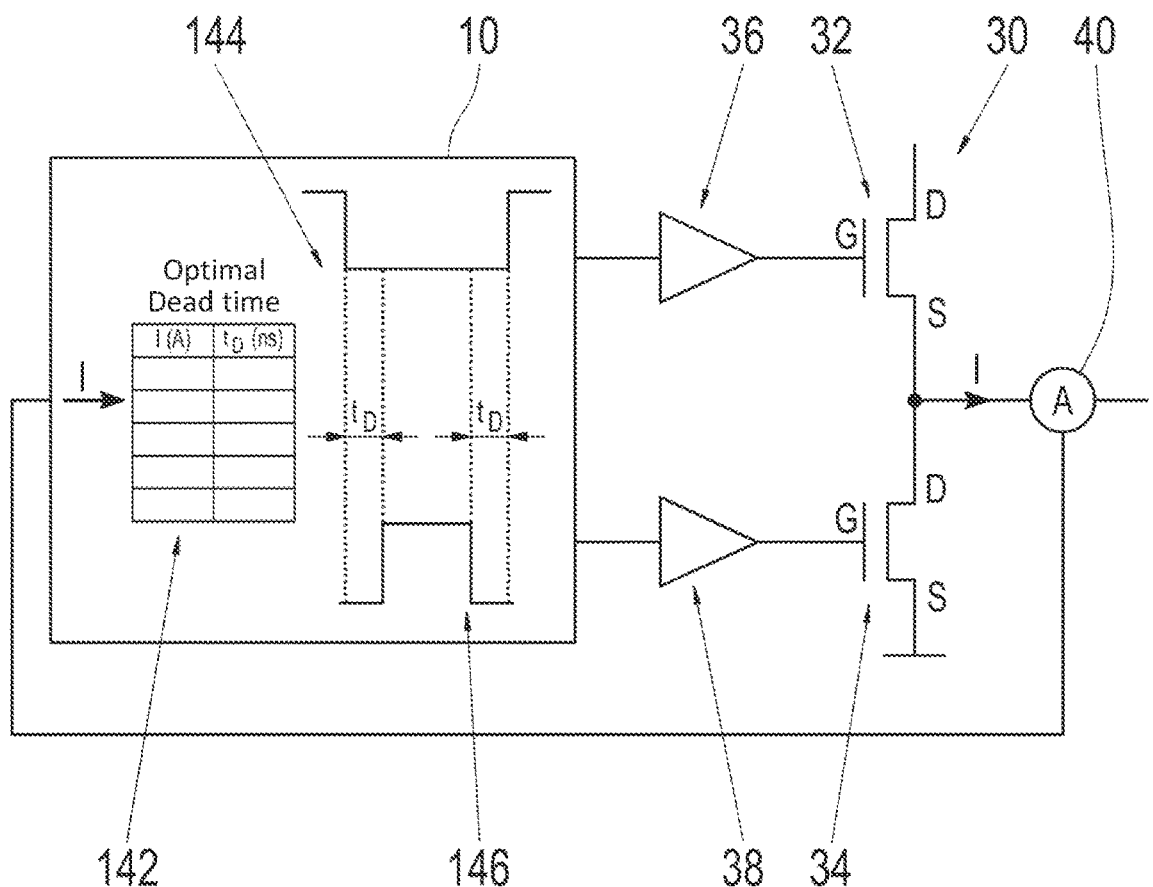
FIG. 2 shows a schematic illustration of a bridge circuit controlled by the controller.

FIG. 1 shows a schematic illustration of a controller 10 according to one embodiment. The controller 10 comprises an input interface 12, an evaluation unit 14, and a signal unit 16. An output current that is measured at an output of a bridge circuit 30, e.g. by means of an ampere meter 40 (FIG. 2), is received via the input interface 12. The evaluation unit 14 evaluates the output current and determines an adaptive dead time based thereon. The evaluation unit 14 uses a table 142 for this, as shown by way of example in FIG. 2, in which the data for the adaptive dead time to, as a function of the load current, are stored.

Figure 3:
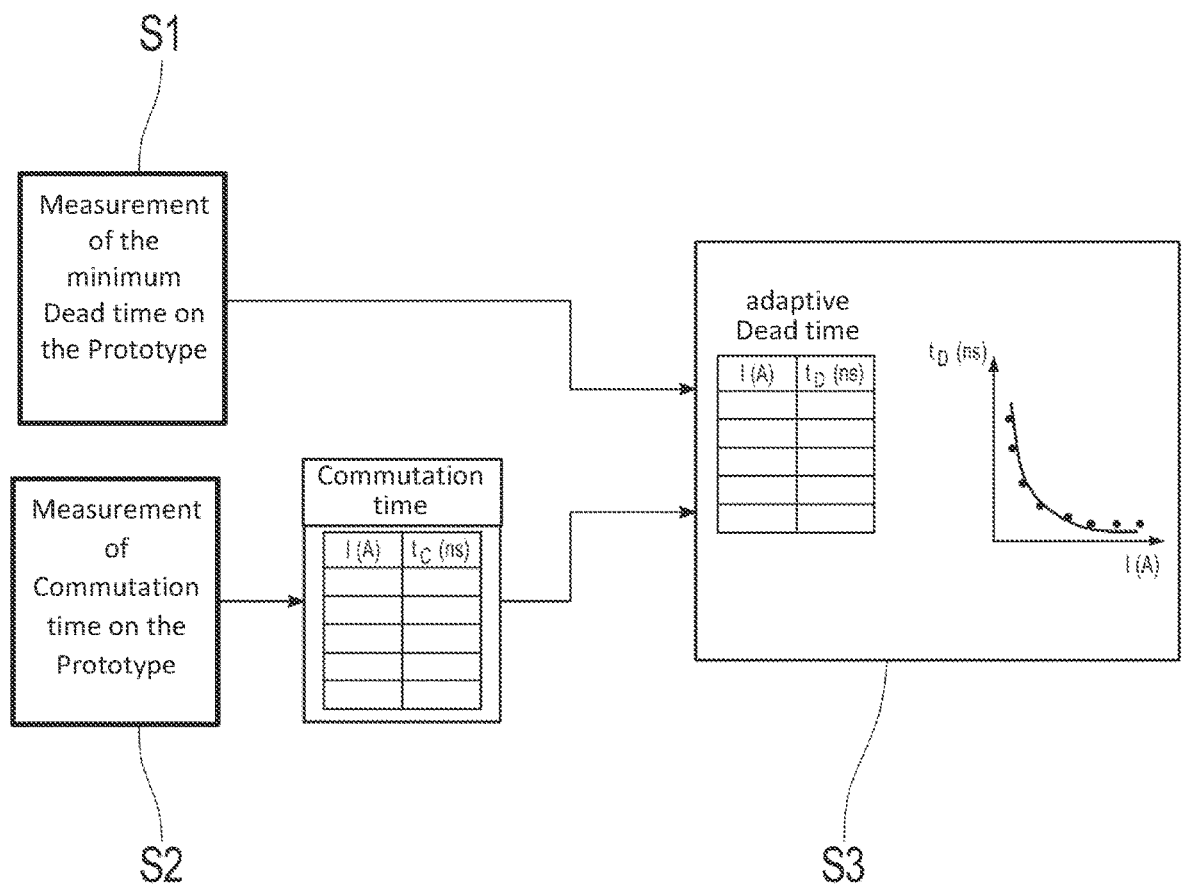
FIG. 3 shows a schematic illustration of a method for optimizing a dead time for the bridge circuit.

FIG. 3 shows the method for determining the adaptive dead time schematically, by means of which the data in table 142 are obtained: in a first step S1, the minimum dead time (minimum value) is measured on a bridge circuit prototype. In a second step S2, the commutation time $t_C$ is measured in relation to the load current I on the same, or another, bridge circuit prototype. In another step, the measurement results from steps S1 and S2 are combined in order to obtain the adaptive dead time $t_D$ based on the load current I. The adaptive dead time can be stored along with the associated load current values in a table, as shown in FIG. 3, by way of example. Alternatively or additionally, an approximation formula, $t_D = aI^{-b}$, can be determined on the basis of the pairs of values in which each pair comprises both the adaptive dead time and the associated load current. The variables a and b are approximation parameters.

The evaluation unit 14 determines the adaptive dead time to using the table 142. Based on this, the signal unit 16 generates a control signal, which is sent to the bridge circuit 30. The activation of the bridge circuit 30 by the controller 10 in FIG. 1 is also shown schematically in FIG. 2. A first control signal 144 for activating the gate in the HS switch 32 is shown schematically as a square PWM signal. A second control signal 146 for activating the gate in the LS switch 34 is likewise shown schematically as a square PWM signal, wherein the adaptive dead time to determined by the evaluation unit 14 is taken into account. As shown by way of example in FIG. 2, the two control signals are inverted in relation to one another, wherein there is a phase for the length of the dead time, during which neither of the two switches are activated. In the second PWM signal for the LS switch 34, the signal flanks are displaced laterally by to with respect to the signal flanks of the first PWM signal for the HS switch. Concurrently, the signal flanks in the first PWM signal for the HS switch 32 are likewise displaced by to in relation to the signal flanks in the second PWM signal for the LS switch 34.

REFERENCE SYMBOLS 10 controller
12 input interface
14 evaluation unit
142 table
144 first control signal
146 second control signal
16 signal unit
30 bridge circuit
32 high side switch
34 low side switch
36 first gate control
38 second gate control
40 current measurement device
S1-S3 steps of the method

The invention claimed is:

1. A controller for controlling a bridge circuit in a vehicle power module, the controller comprising:
   an input interface configured to receive an output current from the bridge circuit;
   an evaluation unit configured to determine an adaptive dead time based on the output current, wherein the adaptive dead time is related to a predetermined commutation time for the bridge circuit and is limited by a predetermined minimum value; and
   a signal unit configured to generate a control signal for sending the adaptive dead time to the bridge circuit,
   wherein the input interface is also configured to receive the predetermined commutation time and the predetermined minimum value.

2. The controller according to claim 1, wherein the predetermined commutation time is defined as a time period, within which a drain-source voltage ($V_{DS}$) for the bridge circuit decreases from a starting value to at least one of 30%, 25%, 20%, 15%, 5%, or 0% of the starting value.

3. The controller according to claim 1, wherein the evaluation unit is configured to set the adaptive dead time to at least one of the minimum value for a first portion of the output current above a predefined threshold value, or the predetermined commutation time for a second portion of the output current below the threshold value.

4. The controller according to claim 1, wherein the evaluation unit is configured to select the adaptive dead time from at least one of a table or a variable field, based on the output current.

5. The controller according to claim 1, wherein the evaluation unit is configured to select the adaptive dead time according to an approximation formula based on the output current.

6. A control method for controlling a bridge circuit in a vehicle power module, the method comprising:
receiving, by an input interface, a predetermined commutation time for the bridge circuit and a predetermined minimum value;
receiving an output current from the bridge circuit;
determining an adaptive dead time based on the received output current, wherein the adaptive dead time is related to the predetermined commutation time for the bridge circuit, and limited by the predetermined minimum value; and
generating a control signal for sending the adaptive dead time to the bridge circuit.

7. A method for determining an adaptive dead time for a bridge circuit, the method comprising:
measuring a minimum value for the dead time for the bridge circuit;
measuring a commutation time for the bridge circuit based on an output current from the bridge circuit;
receiving the minimum value and the commutation time via an input interface of a controller; and
combining the measured commutation time with the determined minimum value to obtain an adaptive dead time based on the output current, which is related to the measured commutation time and limited by the determined minimum value.

8. The controller according to claim 2, wherein the evaluation unit is configured to set the adaptive dead time to at least one of a minimum value for a first portion of the output current above a predefined threshold value, or the predetermined commutation time for a second portion of the output current below the threshold value.

9. The controller according to claim 2, wherein the evaluation unit is configured to select the adaptive dead time from at least one of a table or a variable field, based on the output current.

10. The controller according to claim 2, wherein the evaluation unit is configured to select the adaptive dead time according to an approximation formula based on the output current.

11. The method according to claim 6, wherein the predetermined commutation time is defined as a time period, within which a drain-source voltage ($V_{DS}$) for the bridge circuit decreases from a starting value to at least one of 30%, 25%, 20%, 15%, 5%, or 0% of the starting value.

12. The method according to claim 6, further comprising setting the adaptive dead time to at least one of the minimum value for a first portion of the output current above a predefined threshold value, or the predetermined commutation time for a second portion of the output current below the threshold value.

13. The method according to claim 6, further comprising selecting the adaptive dead time from at least one of a table or a variable field, based on the output current.

14. The method according to claim 6, further comprising selecting the adaptive dead time according to an approximation formula based on the output current.

* * * * *